(12) United States Patent
Kousai

(10) Patent No.: US 7,688,145 B2
(45) Date of Patent: Mar. 30, 2010

(54) VARIABLE GAIN AMPLIFYING DEVICE

(75) Inventor: Shouhei Kousai, Pasadena, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/240,071

(22) Filed: Sep. 29, 2008

(65) Prior Publication Data

US 2009/0085665 A1    Apr. 2, 2009

(30) Foreign Application Priority Data

Oct. 2, 2007    (JP)    ............................. 2007-258543

(51) Int. Cl.
*H03F 3/45* (2006.01)
(52) U.S. Cl. ...................... 330/254; 330/261
(58) Field of Classification Search ................. 330/254, 330/253, 261, 51
See application file for complete search history.

(56) References Cited

U.S. PATENT DOCUMENTS

| 6,011,437 | A | 1/2000 | Sutardja et al. |
| 6,842,071 | B1 | 1/2005 | Retz et al. |
| 7,009,449 | B2 * | 3/2006 | Habring et al. ............. 330/254 |
| 7,023,275 | B2 * | 4/2006 | Miyamoto .................. 330/254 |
| 7,417,506 | B2 * | 8/2008 | Klein et al. ................. 330/254 |
| 7,420,410 | B2 * | 9/2008 | Ohba ............................ 330/9 |
| 7,560,986 | B2 * | 7/2009 | Kocaman .................... 330/254 |
| 2006/0038710 | A1 | 2/2006 | Staszewski et al. |

FOREIGN PATENT DOCUMENTS

AO    2000-40922    2/2000

* cited by examiner

*Primary Examiner*—Henry K Choe
(74) *Attorney, Agent, or Firm*—Oblon, Spivak, McClelland, Maier & Neustadt, L.L.P

(57) ABSTRACT

A variable gain amplifying device that amplifies an input signal and outputs the amplified signal, has a controlling circuit that controls the gain by controlling turning on and off of first MOS transistors and third MOS transistors so that the sum of the number of first MOS transistors turned on and the number of third MOS transistors turned on is "n" by outputting a control signal to the gates of the first MOS transistors and the third MOS transistors.

16 Claims, 10 Drawing Sheets

VARIABLE GAIN AMPLIFYING DEVICE

CROSS-REFERENCE TO RELATED APPLICATION

This application is based upon and claims the benefit of priority from the prior Japanese Patent Application No. 2007-258543, filed on Oct. 2, 2007, the entire contents of which are incorporated herein by reference.

BACKGROUND OF THE INVENTION

1. Field of the Invention

The present invention relates to an amplifier used for radio communication. In particular, it relates to a variable gain amplifying device used in a power amplifier.

2. Background Art

Conventionally, amplifiers have been used in radio communication for signal amplification. The gain characteristics of the amplifiers have to be adjusted according to the application.

For example, a conventional amplifier has a gain compensating circuit disposed on the input side of, between stages, or between the main signal line and the ground on the output side of a multistage amplifier. The gain compensating circuit has a series circuit of a capacitor and a variable capacitance element, an inductive element connected in parallel with the series circuit, and a choke circuit connected between the capacitor and the variable capacitance element (see Japanese Patent Laid-Open No. 2000-40922, for example).

The conventional amplifier has flat gain characteristics from low temperature to high temperature because of the configuration described above.

However, the conventional amplifier cannot change the gain characteristics.

For example, another conventional amplifier can change the gain characteristics and the output power by changing the number of amplifying stages connected in parallel using a switch (see US Patent Application Publication No. 2006/0038710, for example).

However, when the latter conventional amplifier increases the number of parallel amplifying stages by turning on and off the switch, the output impedance decreases in inverse proportion to the number of parallel amplifying stages. In this case, the gain characteristics and the output power are not proportional to the number of parallel amplifying stages.

Therefore, the latter conventional amplifier cannot control the gain characteristics and the output power in proportion to the number of parallel amplifying stages. In other words, the latter conventional amplifier has a problem that the gain characteristics and the output power are difficult to control.

SUMMARY OF THE INVENTION

According to one aspect of the present invention, there is provided: a variable gain amplifying device that amplifies an input signal and outputs the amplified signal, comprising:

a first input terminal to which a first input signal is input;
a second input terminal;
an inductor connected to a power supply at one end;
an output terminal connected to the other end of said inductor;
a first switch stage having "n" first MOS transistors having the same size and connected to said other end of said inductor at one end ("n" is an integer equal to or greater than 2);
a first amplifying stage having "n" second MOS transistors having the same size, the second MOS transistors being connected to said first MOS transistors in a one-to-one correspondence, each of the second MOS transistors being connected between the ground and another end of the corresponding one of said first MOS transistors, and all the second MOS transistors being commonly connected to said first input terminal at the gate thereof;
a second switch stage having "n" third MOS transistors having the same size as the first MOS transistors and connected to said other end of said inductor at one end thereof;
a second amplifying stage having "n" fourth MOS transistors having the same size as said second MOS transistors, the fourth MOS transistors being connected to said third MOS transistors in a one-to-one correspondence, each of the fourth MOS transistors being connected between the ground and another end of the corresponding one of said third MOS transistors, and all the fourth MOS transistors being commonly connected to said second input terminal at the gate thereof; and
a controlling circuit that controls the gain by controlling turning on and off of said first MOS transistors and said third MOS transistors so that the sum of the number of first MOS transistors turned on and the number of third MOS transistors turned on is "n" by outputting a control signal to the gates of said first MOS transistors and said third MOS transistors.

DETAILED DESCRIPTION

In the following, embodiments of the present invention will be described with reference to the drawings.

EMBODIMENT 1

Figure 1:
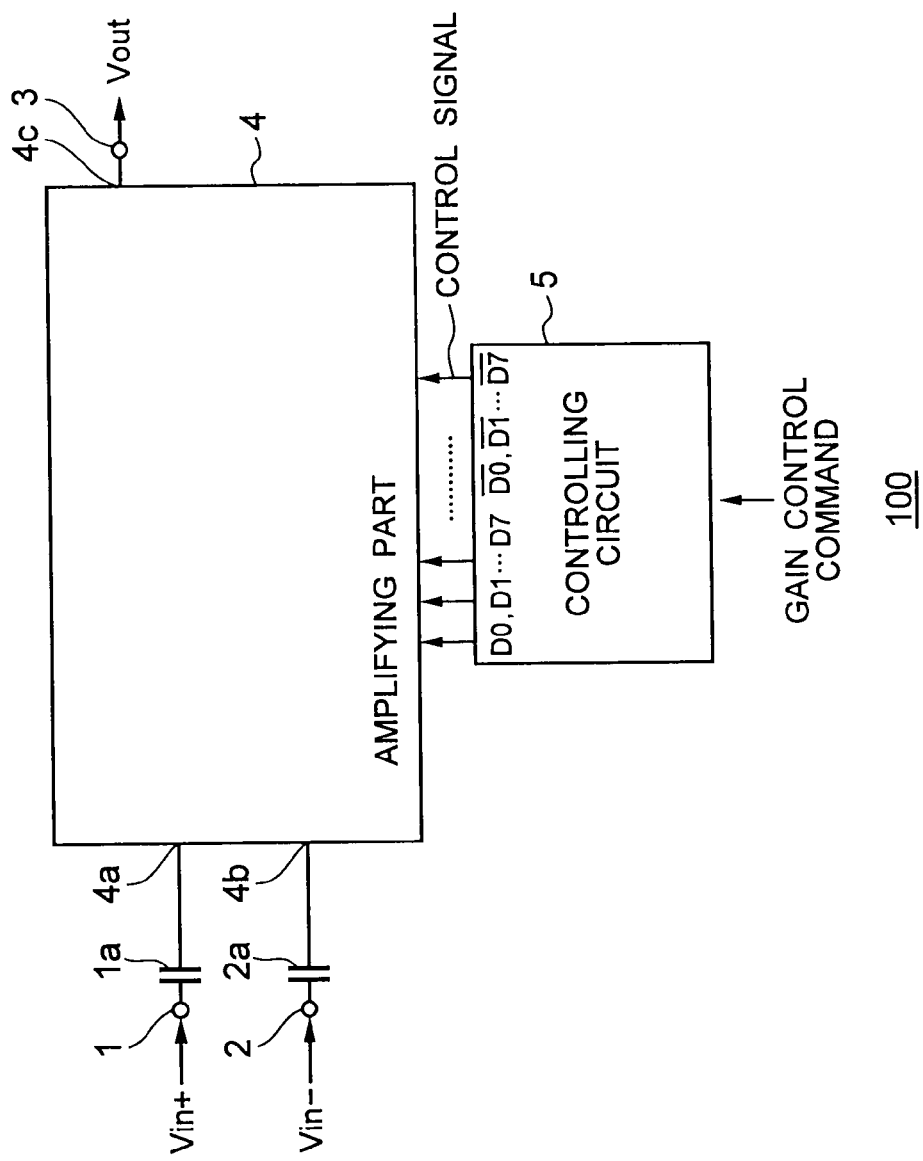
FIG. 1 is a diagram showing a configuration of essential parts of a variable gain amplifying device 100 according to an embodiment 1 of the present invention, which is an aspect of the present invention.
Figure 2:
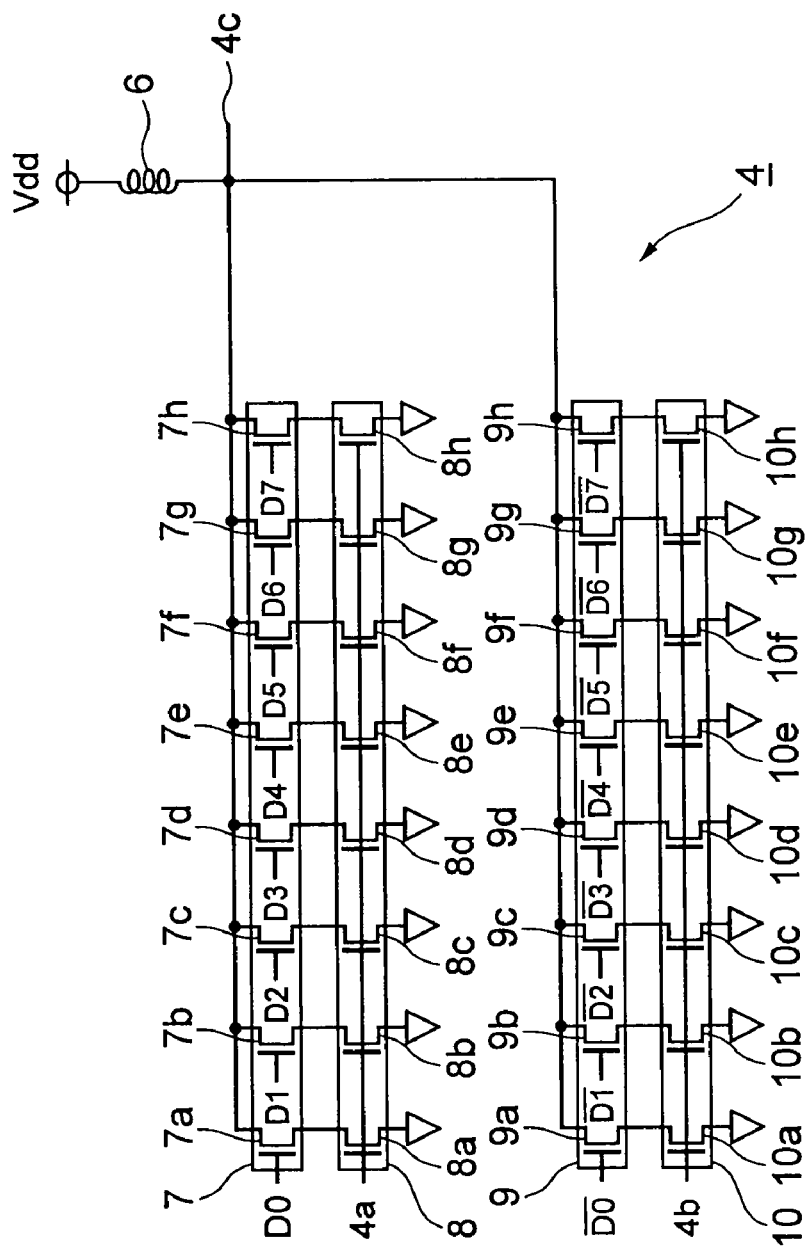
FIG. 2 is a diagram showing an exemplary configuration of essential parts of an amplifying part 4 shown in FIG. 1.

FIG. 1 is a diagram showing a configuration of essential parts of a variable gain amplifying device 100 according to an embodiment 1 of the present invention, which is an aspect of the present invention. FIG. 2 is a diagram showing an exemplary configuration of essential parts of an amplifying part 4 shown in FIG. 1.

As shown in FIG. 1, the variable gain amplifying device 100 has a first input terminal 1, a second input terminal 2, an output terminal 3, the amplifying part 4 and a controlling circuit 5.

A first input signal "Vin+" is input to the first input terminal 1.

A first capacitor 1a is connected between the first input terminal 1 and a first input part 4a of the amplifying part 4.

A second input signal "Vin−", which having a inverted phase compared to a phase of the first input signal "Vin+", is input to the second input terminal 2.

A second capacitor 2a is connected between the second input terminal 2 and a second input part 4b of the amplifying part 4.

As described above, in this embodiment, two complementary signals are input to the variable gain amplifying device 100 via the first input terminal 1 and the second input terminal 2. Then, the variable gain amplifying device 100 amplifies the input signals in the amplifying part 4 and outputs a single phase signal from the output terminal 3.

Alternatively, as in other embodiments described later, the variable gain amplifying device 100 may amplify the two input complementary signals in the amplifying part and output differential signals from output terminals. Alternatively, the variable gain amplifying device 100 may receive one signal, amplify the input signal in the amplifying part and output a single phase signal from the output terminal.

In addition, as shown in FIG. 1, in response to a gain control command input by a user or an external circuit (not shown), the controlling circuit 5 outputs control signals D0 to D7 and /D0 to /D7 to control the gain in the amplifying part 4. The control signals /D0 to /D7 are signals equivalent to inversion signals of the control signals D0 to D7. The control signals D0 to D7 and /D0 to /D7 are digital signals, for example.

As shown in FIG. 2, the amplifying part 4 has an inductor 6, a first switch stage 7, a first amplifying stage 8, a second switch stage 9, and a second amplifying stage 10.

The inductor 6 is connected to a power supply "Vdd" at one end and to the output terminal 3 at the other end. The inductor 6 is provided to prevent direct current (DC) voltage drop.

The first switch stage 7 is composed of eight first MOS transistors 7a to 7h having the same size, for example. The first MOS transistors 7a to 7h are connected to the other end of the inductor 6 (in other words, to the output terminal 3 via an output part 4c) at one end (drain) thereof. Furthermore, the first MOS transistors 7a to 7h receive the control signals D0 to D7, respectively, at the gate thereof.

While this embodiment is described on the assumption that eight first MOS transistors are provided as described above, the same description holds true for a case where "n" first MOS transistors are provided ("n" is an integer equal to or greater than 2).

The first amplifying stage 8 is composed of eight second MOS transistors 8a to 8h having the same size. The second MOS transistors 8a to 8h are connected to the first MOS transistors 7a to 7h in a one-to-one correspondence, and each of the second MOS transistors 8a to 8h is connected between the ground and the remaining end (source) of the corresponding one of the first MOS transistors 7a to 7h. Furthermore, all the second MOS transistors 8a to 8h are commonly connected to the first input terminal 1 via the first capacitor 1a at the gate thereof.

In a case where "n" first MOS transistors are provided, the same number of, "n", second MOS transistors are provided.

The second switch stage 9 is composed of eight third MOS transistors 9a to 9h having the same size as the first MOS transistors 7a to 7h. The third MOS transistors 9a to 9h are connected to the other end (output part 4c) of the inductor 6 at one end (drain) thereof. Furthermore, the third MOS transistors 9a to 9h receive the control signals /D0 to /D7, respectively, at the gate thereof.

In a case where "n" first MOS transistors are provided, the same number of, "n", third MOS transistors are provided.

The second amplifying stage 10 is composed of eight fourth MOS transistors 10a to 10h having the same size as the second MOS transistors 8a to 8h. The fourth MOS transistors 10a to 10h are connected to the third MOS transistors 9a to 9h in a one-to-one correspondence, and each of the fourth MOS transistors 10a to 10h is connected between the ground and the remaining end (source) of the corresponding one of the third MOS transistors 9a to 9h. Furthermore, all the fourth MOS transistors 10a to 10h are commonly connected to the second input terminal 2 via the second capacitor 2a at the gate thereof.

In a case where "n" first MOS transistors are provided, the same number of, "n", fourth MOS transistors are provided.

The controlling circuit 5 controls turning on/off of the first MOS transistors 7a to 7h and the third MOS transistors 9a to 9h so that the sum of the number of first MOS transistors 7a to 7h turned on and the number of third MOS transistors 9a to 9h turned on is eight.

In a case where "n" first MOS transistors are provided, the controlling circuit 5 controls turning on/off of the first MOS transistors and the third MOS transistors so that the sum of the number of first MOS transistors turned on and the number of third MOS transistors turned on is "n".

Next, an operation of the variable gain amplifying device 100 having the configuration described above will be described.

When the controlling circuit 5 receives a gain control command to increase the gain, the controlling circuit 5 outputs the control signals D0 to D7 and /D0 to /D7 to increase the number of first MOS transistors 7a to 7h turned on while decreasing the number of third MOS transistors 9a to 9h turned on, for example.

At this time, the controlling circuit 5 controls turning on/off of the first MOS transistors 7a to 7h and the third MOS transistors 9a to 9h so that the sum of the number of first MOS transistors 7a to 7h turned on and the number of third MOS transistors 9a to 9h turned on is eight.

Therefore, in the operation described above, the number of MOS transistors turned on and the number of MOS transistors turned off are equal to each other, so that the output impedance of the amplifying part 4 is kept constant.

As described above, in this embodiment, the first input signal "Vin+" and the second input signal "Vin−" are complementary signals. The amplifying part 4 outputs the difference between a signal component based on the first input signal "Vin+" and a signal component based on the second input signal "Vin−" as an output signal to the output terminal 3. Therefore, when the output impedance of the amplifying part 4 is kept constant as described above, the amplitude (power) of the output signal of the amplifying part 4 is proportional to the absolute value of the difference between the number of first MOS transistor turned on and the number of third MOS transistors turned on.

For example, a case will be considered where the number of first MOS transistors turned on is increased from five to six. In this case, the absolute value of the difference increases from two (the number of first MOS transistors turned on is five, and the number of third MOS transistors turned on is three) to four (the number of first MOS transistors turned on is six, and the number of third MOS transistors turned on is two). That is, the absolute value of the difference increases from two to four, and the amplitude of the output signal increases to two times.

Furthermore, a case will be considered where the number of first MOS transistors turned on is increased from six to seven. In this case, the absolute value of the difference increases from four (the number of first MOS transistors turned on is six, and the number of third MOS transistors turned on is two) to six (the number of first MOS transistors turned on is seven, and the number of third MOS transistors turned on is one). That is, the absolute value of the difference increases from four to six (increases to 1.5 times), and the amplitude of the output signal increases to 1.5 times.

In this way, the controlling circuit 5 increases the gain of the amplifying part 4 by controlling the number of first MOS transistors turned on.

On the other hand, when the controlling circuit 5 receives a gain control command to decrease the gain, the controlling circuit 5 outputs the control signals D0 to D7 and /D0 to /D7 to decrease the number of first MOS transistors 7a to 7h turned on while increasing the number of third MOS transistors 9a to 9h turned on, for example.

At this time, the controlling circuit 5 controls turning on/off of the first MOS transistors 7a to 7h and the third MOS transistors 9a to 9h so that the sum of the number of first MOS transistors 7a to 7h turned on and the number of third MOS transistors 9a to 9h turned on is eight.

Therefore, as described earlier, in the operation described above, the number of MOS transistors turned on and the number of MOS transistors turned off are equal to each other, so that the output impedance of the amplifying part 4 is kept constant.

As a result, the amplitude (power) of the output signal of the amplifying part 4 is proportional to the absolute value of the difference between the number of first MOS transistor turned on and the number of third MOS transistors turned on.

Therefore, as in the case of increasing the gain described above, the controlling circuit 5 controls the first MOS transistors 7a to 7h and the third MOS transistors 9a to 9h in such a manner that the absolute value of the difference is decreased while satisfying the control condition described above. Thus, the gain of the amplifying part 4 can be decreased in proportion to the absolute value of the difference.

As described above, the controlling circuit 5 controls the operation of the MOS transistors in such a manner that a fixed number of MOS transistors in the first and second amplifying stages are turned on. That is, the output impedance of the amplifying part 4 of the variable gain amplifying device 100 is controlled to be constant.

Thus, the variable gain amplifying device 100 can linearly control the gain by linearly increasing or decreasing the output signal in response to a gain control command to increase or decrease the gain.

As described above, the variable gain amplifying device according to this embodiment can easily control the gain characteristics and the output power.

In this embodiment, a case where parallel eight MOS transistors are provided in each of the first and second switch stages and the first and second amplifying stages (a case of 8 bit) has been described as an example. However, if necessary, the range of variation of the gain can be widened by increasing the number of MOS transistors provided in parallel.

EMBODIMENT 2

In the embodiment 1, an example of the configuration of the amplifying part applied to the variable gain amplifying device has been described.

In the amplifying part according to the embodiment 1, a distortion due to the MOS transistors in the first and second switch stages or the MOS transistors in the first and second amplifying stages can occur when the amplitude of the output signal "Vout" increases.

If such a distortion occurs, the gain of the amplifying part can fail to linearly increase in response to the control signal output from the controlling circuit 5. Furthermore, the distortion can cause amplitude modulation (AM)/phase modulation (PM) conversion in the amplifying part.

Thus, in an embodiment 2, there will be described another example of the configuration of the amplifying part applied to the variable gain amplifying device that can reduce the effect of the distortion.

Figure 3:
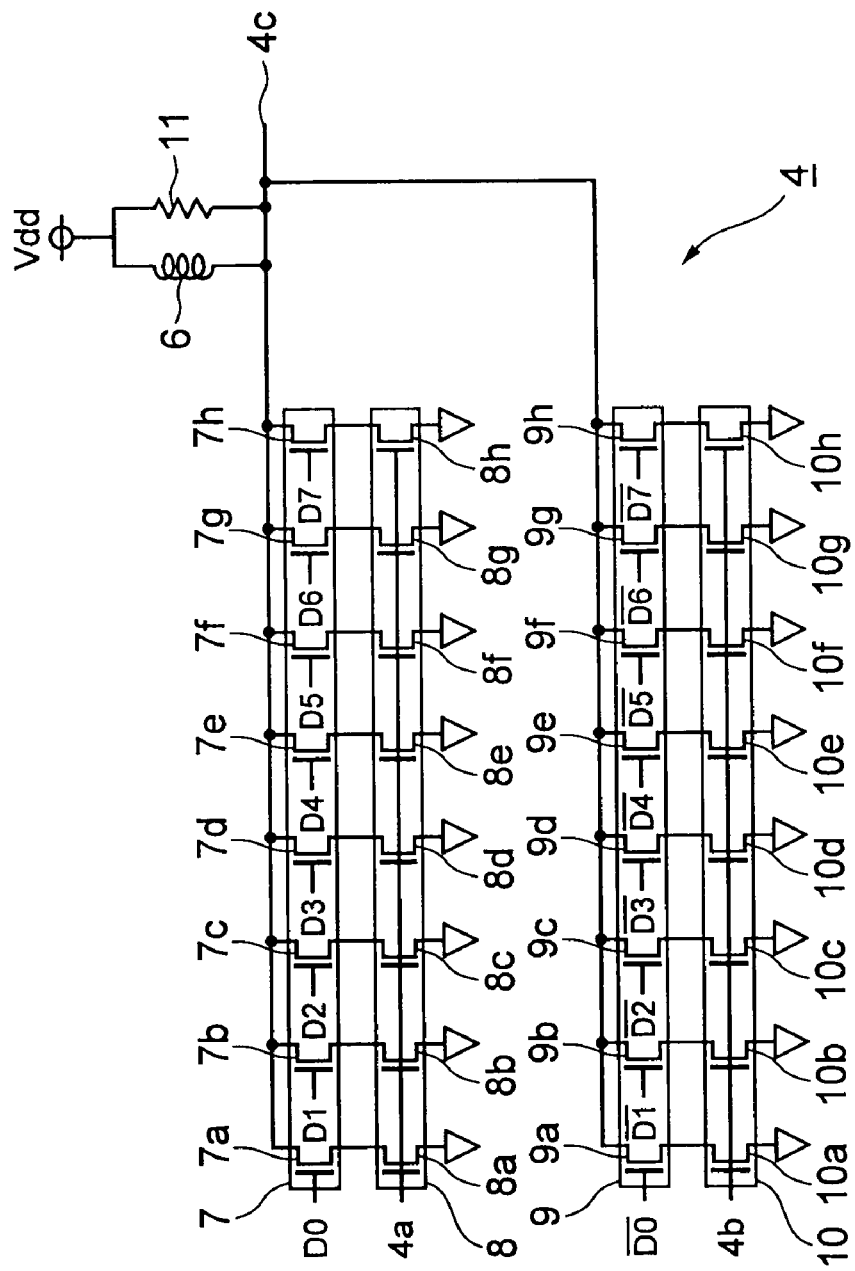
FIG. 3 is a diagram showing a configuration of essential parts of the amplifying part 4 according to the embodiment 2 of the present invention, which is an aspect of the present invention.

FIG. 3 is a diagram showing a configuration of essential parts of the amplifying part 4 according to the embodiment 2 of the present invention, which is an aspect of the present invention.

Furthermore, as with the amplifying part 4 according to the embodiment 1, the amplifying part according to the embodiment 2 is applied to the variable gain amplifying device 100 shown in FIG. 1.

As shown in FIG. 3, compared with the embodiment 1, the amplifying part 4 further has a resistor 11 connected in parallel with the inductor 6 between the power supply "Vdd" and one ends (drains) of the first MOS transistors 7a to 7h. That is, the amplifying part 4 has the resistor 11 as a terminating resistor.

The resistor 11 that functions as a terminating resistor limits the increase of the output signal "Vout". Therefore, the distortion in the switch stages and the amplifying stages is reduced. As a result, the controlling circuit 5 can linearly control the gain in response to the control signal. Furthermore, the AM/PM conversion in the amplifying part 4 can be reduced.

The operation of the variable gain amplifying device 100 in which the amplifying part 4 according to the embodiment 2 is used is the same as the operation in the embodiment 1.

As described above, as in the embodiment 1, the variable gain amplifying device according to this embodiment can easily control the gain characteristics and the output power.

EMBODIMENT 3

In the embodiment 2, another example of the configuration of the amplifying part applied to the variable gain amplifying device has been described.

In an embodiment 3, there will be described another example of the configuration of the amplifying part applied to the variable gain amplifying device.

Figure 4:
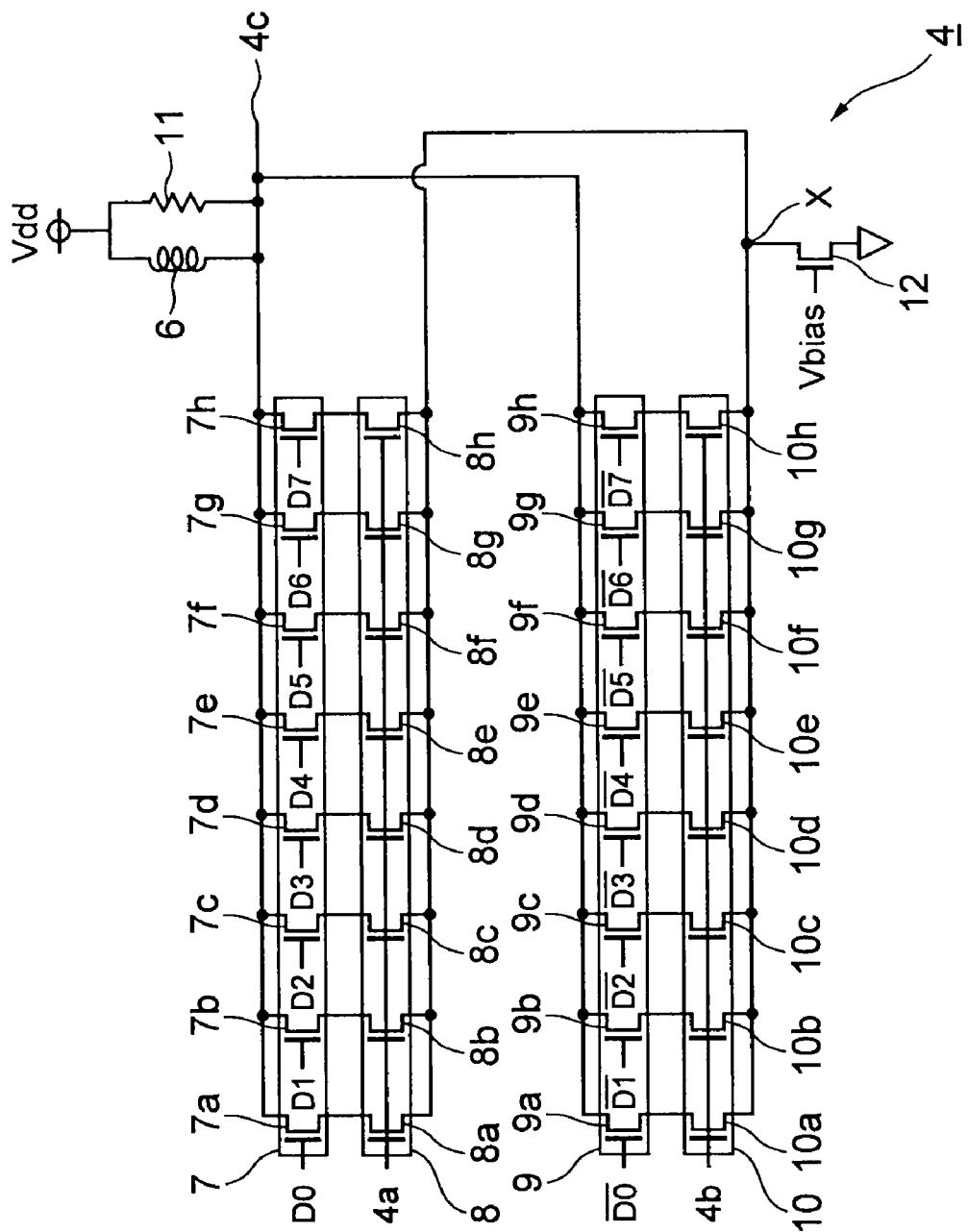
FIG. 4 is a diagram showing a configuration of essential parts of the amplifying part 4 according to the embodiment 3 of the present invention, which is an aspect of the present invention.

FIG. 4 is a diagram showing a configuration of essential parts of the amplifying part 4 according to the embodiment 3 of the present invention, which is an aspect of the present invention.

Furthermore, as with the amplifying part 4 according to the embodiment 2, the amplifying part according to the embodiment 3 is applied to the variable gain amplifying device 100 shown in FIG. 1.

As shown in FIG. 4, compared with the embodiment 2, the amplifying part 4 further has a current source 12 connected between the ground and a point of connection "x" between the other ends (sources) of the second MOS transistors 8a to 8h and the other ends (sources) of the fourth MOS transistors 10a to 10h. That is, the second MOS transistors 8a to 8h and the fourth MOS transistors 10a to 10h are grounded via the current source 12.

As a result, for example, even if the voltage of the power supply "Vdd" fluctuates due to a disturbance or the like, a stable current is supplied to the first switch stage 7, the second switch stage 9, the first amplifying stage 8 and the second amplifying stage 10 from the current source 12. Thus, the amplifying part 4 can stably output the output signal "Vout".

The operation of the variable gain amplifying device 100 in which the amplifying part 4 according to the embodiment 3 is used is the same as the operation in the embodiment 2.

As described above, as in the embodiment 1, the variable gain amplifying device according to this embodiment can easily control the gain characteristics and the output power.

EMBODIMENT 4

In the embodiment 1, an example of the configuration of the variable gain amplifying device has been described.

Here, the "efficiency" of the amplifying part of the variable gain amplifying device can be improved by making the amplifying stages operate (switched operation) in a linear region. The word "efficiency" used herein means the power of the output signal divided by the power consumption of the amplifying part.

A condition for the operation (switched operation) of the amplifying stages in a linear region is that the voltage between the drain and the source of the MOS transistors in the amplifying stages is lower than the difference between the average value "Va" of the voltages of signals input to the amplifying stages and the threshold voltage "Vth" of the MOS transistors.

For example, if the signals input to the amplifying stages are biased, the average voltage value "Va" can be increased to satisfy the condition described above. That is, the amplifying stages of the amplifying part can be made to operate in a linear region, and the "efficiency" can be improved.

Thus, in an embodiment 4, there will be described an example of the configuration of the variable gain amplifying device that biases the signals input to the amplifying stages.

Figure 5:
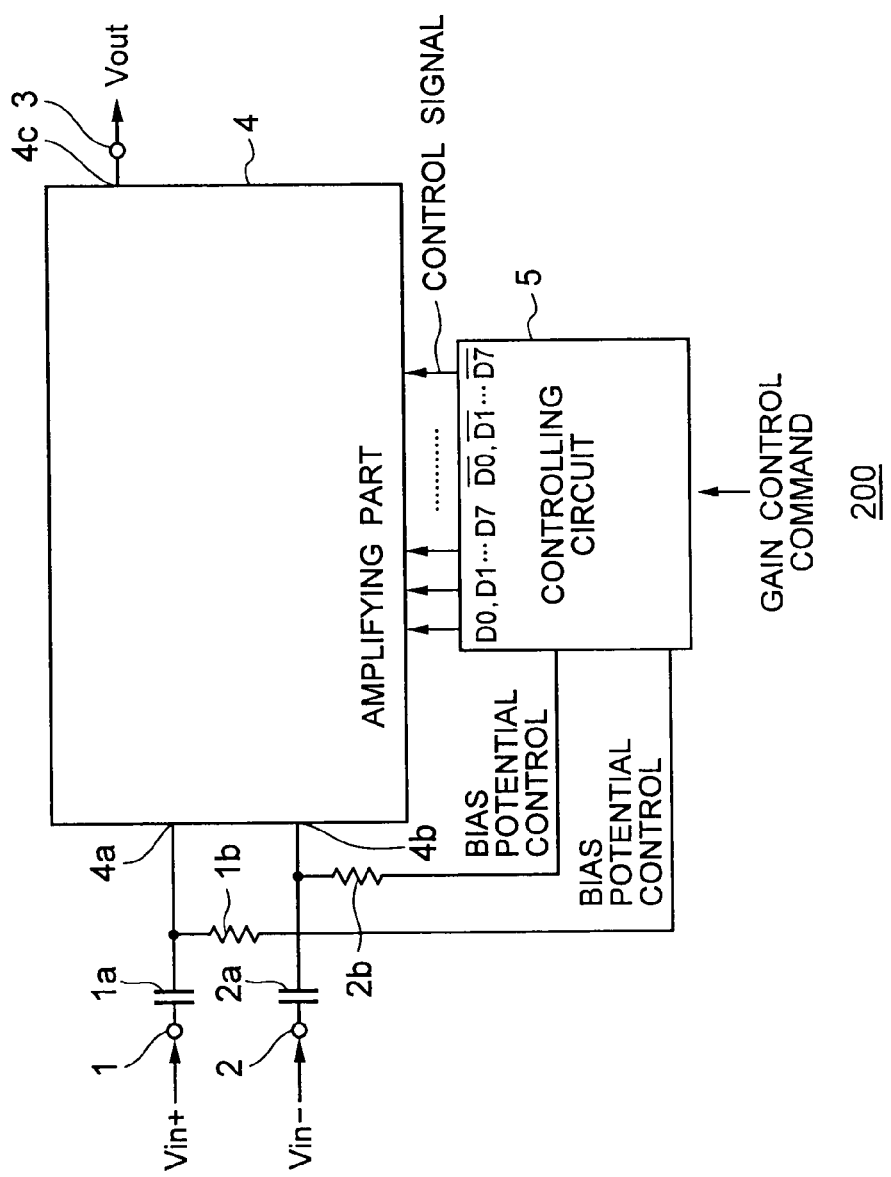
FIG. 5 is a diagram showing a configuration of essential parts of a variable gain amplifying device 200 according the embodiment 4 of the present invention, which is an aspect of the present invention.

FIG. 5 is a diagram showing a configuration of essential parts of a variable gain amplifying device 200 according the embodiment 4 of the present invention, which is an aspect of the present invention.

The components denoted by the same reference numerals as those in the embodiment 1 are the same components as those in the embodiment 1. Furthermore, the amplifying parts 4 according to the embodiments 1 to 3 can be applied to the variable gain amplifying device 200 according to the embodiment 4 as with the variable gain amplifying device 100 according to the embodiment 1.

As shown in FIG. 5, compared with the embodiment 1, the variable gain amplifying device 200 further has a first resistor 1b connected between the first input part 4a and the controlling circuit 5 and a second resistor 2b connected between the second input part 4b and the controlling circuit 5.

The controlling circuit 5 biases the first input signal "Vin+" via the first resistor 1b to make the second MOS transistors 8a to 8h in the first amplifying stage 8 operate in the linear region. Similarly, the controlling circuit 5 biases the second input signal "Vin−" via the second resistor 2b to make the fourth MOS transistors 10a to 10h in the second amplifying stage 10 operate in the linear region.

That is, the controlling circuit 5 performs control to increase the average value "Va" of the voltages of the signals input to the amplifying stages. In this way, the condition described above can be satisfied. That is, the amplifying stages of the amplifying part can be made to operate in the linear region, and the "efficiency" can be improved.

The operation of the variable gain amplifying device 200 is the same as the operation of the variable gain amplifying device 100 according to the embodiment 1.

As described above, as in the embodiment 1, the variable gain amplifying device according to this embodiment can easily control the gain characteristics and the output power.

The variable gain amplifying device 200 according to this embodiment is configured to couple the input signals via capacitors and couple the bias potentials via resistors. However, the functions served by these components can also be served by a transmission line or an inductor, and the present invention is not limited to the configuration described above.

EMBODIMENT 5

In the embodiment 4, there has been described an example of the configuration of the variable gain amplifying device that is designed to make the amplifying stages of the amplifying part operate in the linear region.

Another method of making the amplifying stages operate in the linear region is to input a digital signal. For example, the "High" potential of the digital signals is usually the potential of the power supply "Vdd" or, in other words, is extremely high. Therefore, the amplifying stages ordinarily operate in the linear region. In this case, basing of the input signal in the embodiment 4 is unnecessary.

Thus, in an embodiment 5, there will be described an example of the configuration of a variable gain amplifying device that is designed to make the amplifying stages of the amplifying part operate in the linear region by inputting a digital signal.

Figure 6:
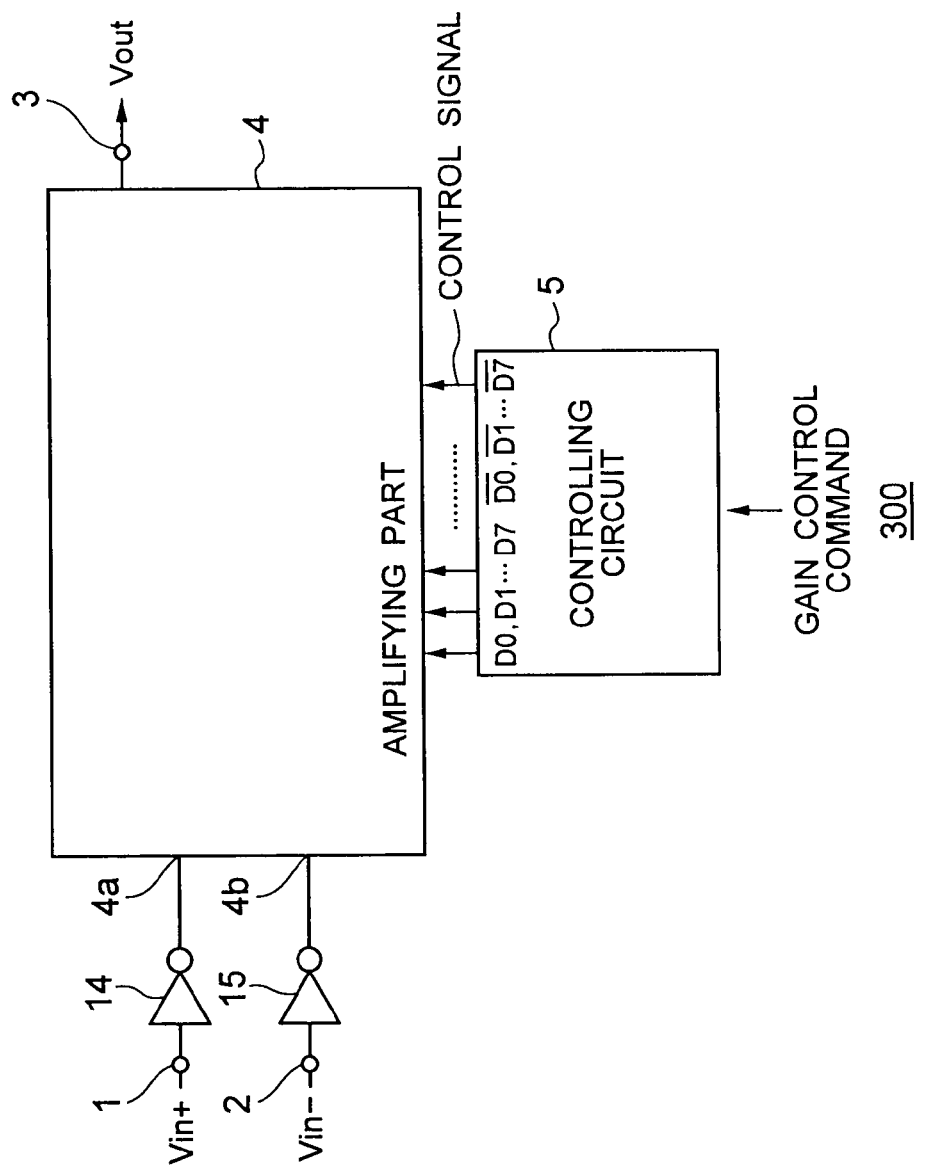
FIG. 6 is a diagram showing a configuration of essential parts of a variable gain amplifying device 300 according the embodiment 5 of the present invention, which is an aspect of the present invention.

FIG. 6 is a diagram showing a configuration of essential parts of a variable gain amplifying device 300 according the embodiment 5 of the present invention, which is an aspect of the present invention.

The components denoted by the same reference numerals as those in the embodiment 1 are the same components as those in the embodiment 1. Furthermore, the amplifying parts 4 according to the embodiments 1 to 3 can be applied to the variable gain amplifying device 300 according to the embodiment 5 as with the variable gain amplifying device 100 according to the embodiment 1.

As shown in FIG. 6, compared with the embodiment 1, the variable gain amplifying device 300 has a first inverter 14 and a second inverter 15. In addition, compared with the variable grain amplifying device 100 according to the embodiment 1, the first capacitor 1a and the second capacitor 2a are omitted in the variable gain amplifying device 300. Furthermore, as described above, the first input signal "Vin+" and the second input signal "Vin−" are digital signals that assume two values at a "High" potential and a "Low" potential.

The first inverter 14 is connected to the first input terminal 1 at the input thereof and to the gates of the second MOS transistors via the first input part 4a at the output thereof.

The second inverter 15 is connected to the second input terminal 2 at the input thereof and to the gates of the fourth MOS transistors via the second input part 4b at the output thereof.

Since the first inverter 14 outputs the first input signal "Vin+" after inverting the phase, so that the phase of the signal input to the first amplifying stage 8 of the amplifying part 4 is inverted compared with the configuration according to the embodiment 1. Similarly, since the second inverter 15 outputs the second input signal "Vin−" after inverting the phase, so that the phase of the signal input to the second amplifying stage 10 of the amplifying part 4 is inverted compared with the configuration according to the embodiment 1.

Therefore, the operation of the variable gain amplifying device 300 having the configuration described above is the same as the operation of the variable gain amplifying device 100 according to the embodiment 1 except that the logic of the signals input to the amplifying part 4 is inverted.

In addition, the input signals of the variable gain amplifying device 300 are digital signals as described above. Therefore, the amplifying stages of the amplifying part can be made to operate in the linear region, and the "efficiency" can be improved.

In addition, as in the embodiment 1, the variable gain amplifying device according to this embodiment can easily control the gain characteristics and the output power.

EMBODIMENT 6

In the embodiments, there have been described examples of the configuration of the variable gain amplifying device in which a signal equivalent to the first input signal to be amplified having an inverted phase (second input signal) is input to the second amplifying stage.

In an embodiment 6, there will be described an example of the configuration of the variable gain amplifying device in which a fixed voltage is applied to the second amplifying stage.

Figure 7:
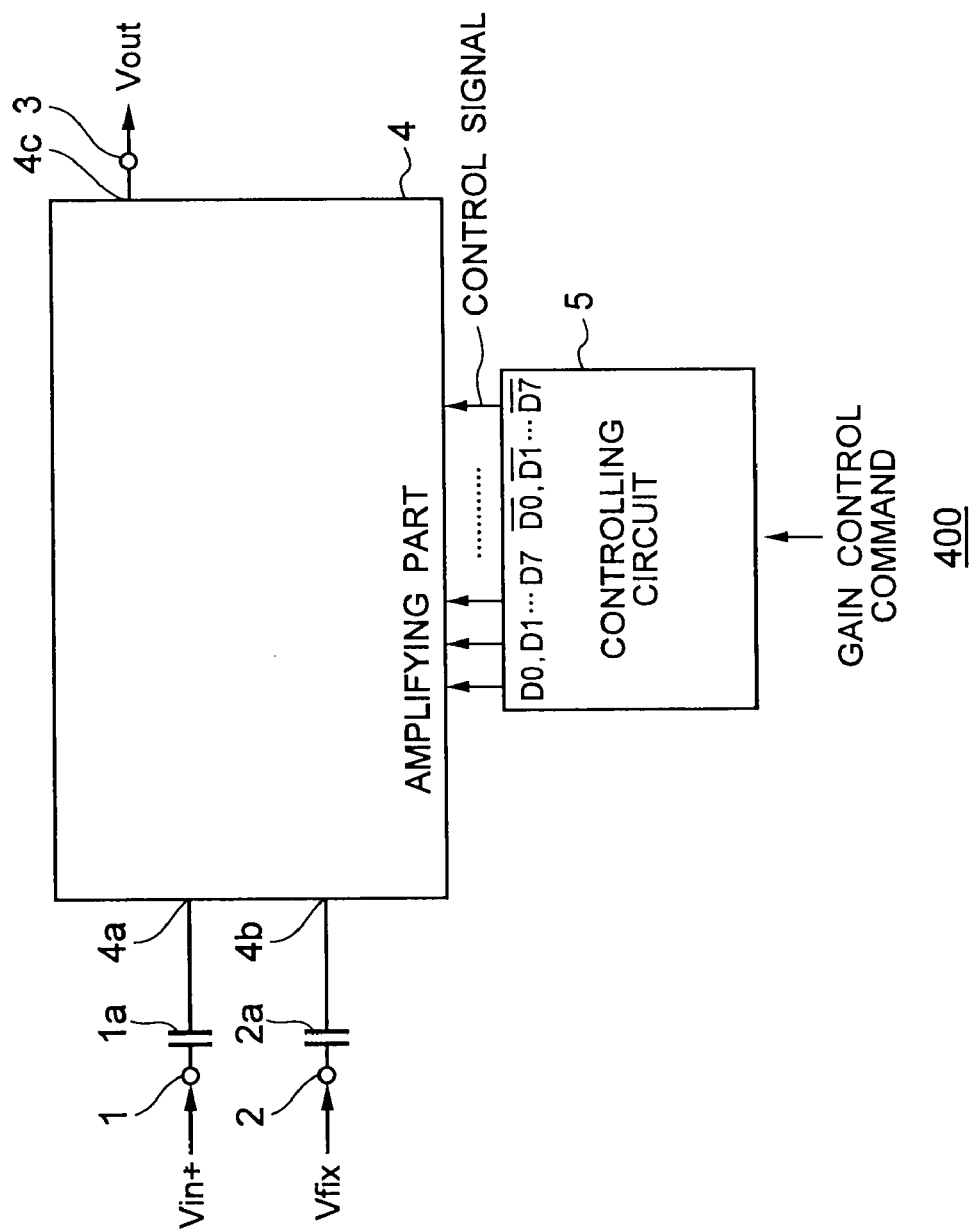
FIG. 7 is a diagram showing a configuration of essential parts of a variable gain amplifying device 400 according to the embodiment 6 of the present invention, which is an aspect of the present invention.

FIG. 7 is a diagram showing a configuration of essential parts of a variable gain amplifying device 400 according to the embodiment 6 of the present invention, which is an aspect of the present invention.

The components denoted by the same reference numerals as those in the embodiment 1 are the same components as those in the embodiment 1. Furthermore, the amplifying parts 4 according to the embodiments 1 to 3 can be applied to the variable gain amplifying device 400 according to the embodiment 6 as with the variable gain amplifying device 100 according to the embodiment 1.

As shown in FIG. 7, the variable gain amplifying device 300 differs from the variable gain amplifying device according to the embodiment 1 in that a fixed voltage "Vfix" is applied to the second input terminal 2. The fixed voltage "Vfix" is the voltage of the power supply "Vdd", for example.

Thus, the fixed voltage "Vfix" is applied to the gates of the fourth MOS transistors 10a to 10h via the second capacitor 2a.

Next, an operation of the variable gain amplifying device 400 having the configuration described above will be described. In the following, a case where the amplifying part 4 shown in FIG. 2 is applied to the variable gain amplifying device 400 will be described as an example.

As in the embodiment 1, when the controlling circuit 5 receives a gain control command to increase the gain, the controlling circuit 5 outputs the control signals D0 to D7 and /D0 to /D7 to increase the number of first MOS transistors 7a to 7h turned on while decreasing the number of third MOS transistors 9a to 9h turned on, for example.

At this time, as in the embodiment 1, the controlling circuit 5 controls turning on/off of the first MOS transistors 7a to 7h and the third MOS transistors 9a to 9h so that the sum of the number of first MOS transistors 7a to 7h turned on and the number of third MOS transistors 9a to 9h turned on is eight.

Therefore, in the operation described above, the number of MOS transistors turned on and the number of MOS transistors turned off are equal to each other, so that the output impedance of the amplifying part 4 is kept constant.

As described above, in this embodiment, the fixed voltage "Vfix" is applied to the gates of the fourth MOS transistors 10a to 10h via the second capacitor 2a. Therefore, the amplifying part 4 outputs a signal component based on the first input signal "Vin+" to the output terminal 3 as an output signal. Therefore, when the output impedance of the amplifying part 4 is kept constant as described above, the amplitude (power) of the output signal of the amplifying part 4 is proportional to the number of first MOS transistors turned on.

In this way, the controlling circuit 5 increases the gain of the amplifying part 4 by controlling the number of first MOS transistors turned on.

On the other hand, as in the embodiment 1, when the controlling circuit 5 receives a gain control command to decrease the gain, the controlling circuit 5 outputs the control signals D0 to D7 and /D0 to /D7 to decrease the number of first MOS transistors 7a to 7h turned on while increasing the number of third MOS transistors 9a to 9h turned on, for example.

At this time, as in the embodiment 1, the controlling circuit 5 controls turning on/off of the first MOS transistors 7a to 7h and the third MOS transistors 9a to 9h so that the sum of the number of first MOS transistors 7a to 7h turned on and the number of third MOS transistors 9a to 9h turned on is eight.

Therefore, as described earlier, in the operation described above, the number of MOS transistors turned on and the number of MOS transistors turned off are equal to each other, so that the output impedance of the amplifying part 4 is kept constant.

As a result, the amplitude (power) of the output signal of the amplifying part 4 is proportional to the number of first MOS transistors turned on.

In this way, as in the case of increasing the gain described above, the controlling circuit 5 controls the first MOS transistors 7a to 7h and the third MOS transistors 9a to 9h to decrease the number of first MOS transistors turned on while satisfying the control condition described above. Thus, the gain of the amplifying part 4 can be decreased in proportion to the number of first MOS transistors turned on.

In this way, the variable gain amplifying device 400 can linearly control the gain by linearly increasing or decreasing the output signal in response to a gain control command to increase or decrease the gain.

As described above, as in the embodiment 1, the variable gain amplifying device according to this embodiment can easily control the gain characteristics and the output power.

EMBODIMENT 7

In the embodiment 1, an example of the configuration of the variable gain amplifying device that provides a single phase output has been described.

In an embodiment 7, an example of the configuration of the variable gain amplifying device that provides differential outputs will be described.

Figure 8:
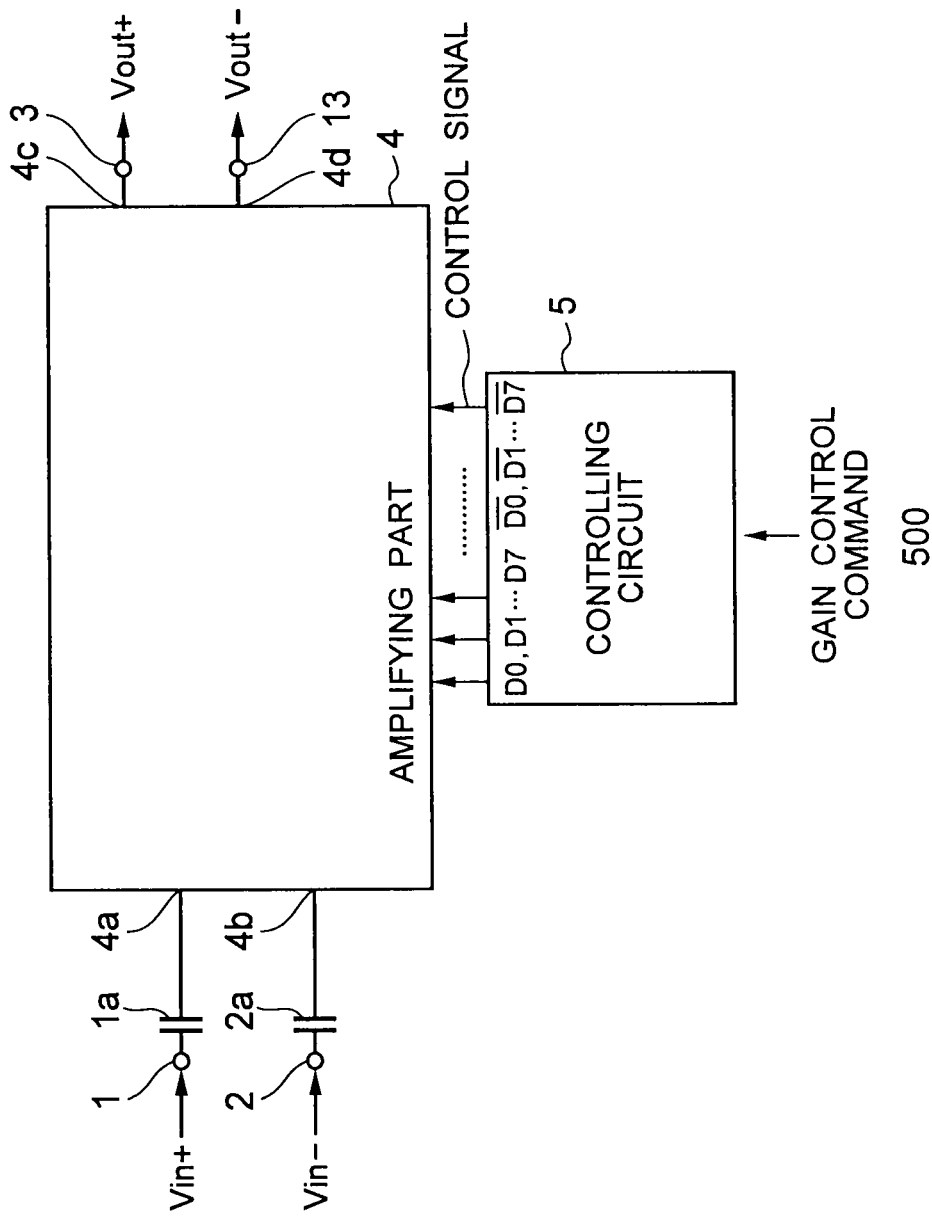
FIG. 8 is a diagram showing a configuration of essential parts of a variable gain amplifying device 500 according to the embodiment 7 of the present invention, which is an aspect of the present invention.
Figure 9:
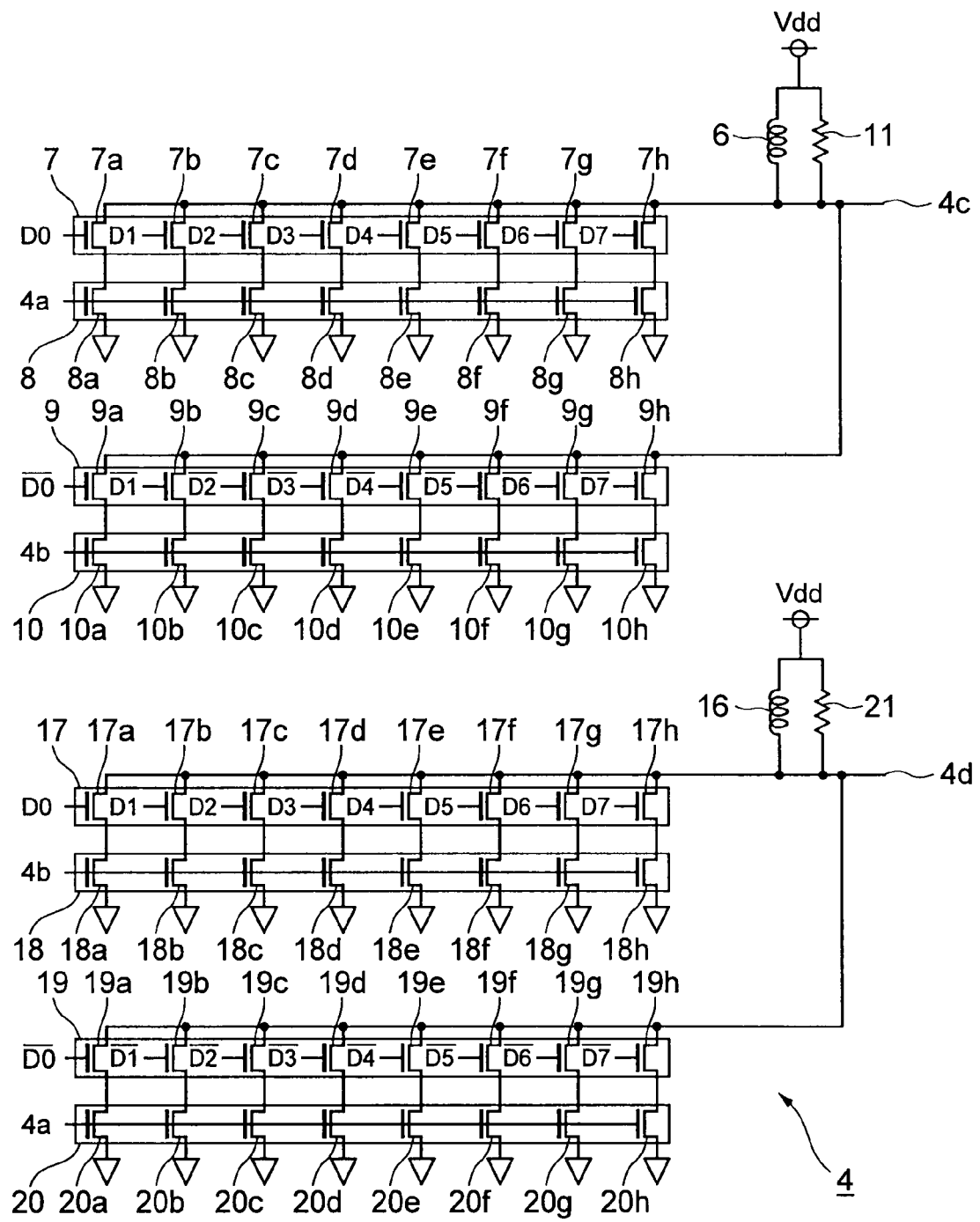
FIG. 9 is a diagram showing a configuration of essential parts of the amplifying part 4 shown in FIG. 8.

FIG. 8 is a diagram showing a configuration of essential parts of a variable gain amplifying device 500 according to the embodiment 7 of the present invention, which is an aspect of the present invention. FIG. 9 is a diagram showing a configuration of essential parts of the amplifying part 4 shown in FIG. 8.

The components denoted by the same reference numerals as those in the embodiments 1 and 2 are the same components as those in the embodiments 1 and 2.

As shown in FIG. 8, compared with the embodiment 1, the variable gain amplifying device 500 further has a second output terminal 13.

From the second output terminal 13, an output signal "Vout−", which is output from the amplifying part 4 via an output part 4d, is output. The output signal "Vout−" is a signal equivalent to an inverted signal of the output signal "Vout+" output from the first output terminal 3.

Furthermore, as shown in FIG. 9, compared with the amplifying part according to the embodiment 2, the amplifying part 4 further has an inductor 16, a resistor 21, a third switch stage 17, a third amplifying stage 18, a fourth switch stage 19 and a fourth amplifying stage 20.

The third switch stage 17 is composed of eight fifth MOS transistors 17a to 17h having the same size as the first MOS transistors, for example. The fifth MOS transistors 17a to 17h are connected to one end of the inductor 16 (in other words, to the second output terminal 13 via the output part 4d) at one end (drain) thereof. Furthermore, the fifth MOS transistors 17a to 17h receive the control signals D0 to D7, respectively, at the gate thereof.

In a case where "n" first MOS transistors are provided, the same number of, "n", fifth MOS transistors are provided.

The resistor 21 is connected in parallel with the inductor 16 between the power supply "Vdd" and one ends (drains) of the fifth MOS transistors 17a to 17h.

The third amplifying stage 18 is composed of eight sixth MOS transistors 18a to 18h having the same size as the second MOS transistors. The sixth MOS transistors 18a to 18h are connected to the fifth MOS transistors 17a to 17h in a one-to-one correspondence, and each of the sixth MOS transistors 18a to 18h is connected between the ground and the remaining end (source) of the corresponding one of the fifth MOS transistors 17a to 17h. Furthermore, all the sixth MOS transistors 18a to 18h are commonly connected to the second input terminal 2 via the second input part 4b and the second capacitor 2a at the gate thereof.

In a case where "n" fifth MOS transistors are provided, the same number of, "n", sixth MOS transistors are provided.

The fourth switch stage 19 is composed of eight seventh MOS transistors 19a to 19h having the same size as the fifth MOS transistors 17a to 17h. The seventh MOS transistors 19a to 19h are connected to the one end of the inductor 16 (in other words, to the second output terminal 13 via the output part 4d) at one end (drain) thereof. Furthermore, the seventh MOS transistors 19a to 19h receive the control signals /D0 to /D7, respectively, at the gate thereof.

In a case where "n" fifth MOS transistors are provided, the same number of, "n", seventh MOS transistors are provided.

The fourth amplifying stage 20 is composed of eight eighth MOS transistors 20a to 20h having the same size as the sixth MOS transistors 18a to 18h. The eighth MOS transistors 20a to 20h are connected to the seventh MOS transistors 19a to 19h in a one-to-one correspondence, and each of the eighth MOS transistors 20a to 20h is connected between the ground and the remaining end (source) of the corresponding one of the seventh MOS transistors 19a to 19h. Furthermore, all the eighth MOS transistors 20a to 20h are commonly connected to the first input terminal 1 via the first input part 4a and the first capacitor 1a at the gate thereof.

In a case where "n" fifth MOS transistors are provided, the same number of, "n", eighth MOS transistors are provided.

The controlling circuit 5 controls turning on/off of the fifth MOS transistors 17a to 17h and the seventh MOS transistors 19a to 19h so that the sum of the number of fifth MOS transistors 17a to 17h turned on and the number of seventh MOS transistors 19a to 19h turned on is eight.

In a case where "n" fifth MOS transistors are provided, the controlling circuit 5 controls turning on/off of the fifth MOS transistors and the seventh MOS transistors so that the sum of the number of fifth MOS transistors turned on and the number of seventh MOS transistors turned on is "n".

That is, the amplifying part 4 shown in FIG. 9 having the configuration described above amplifies differential signals (the input signal "Vin+" input to the first input terminal 1 and the input signal "Vin−" input to the second input terminal 2) and outputs the amplified differential signals via the output parts 4c and 4d.

The variable gain amplifying device 500 outputs the differential signals amplified by the amplifying part 4 (the output signals "Vout+" and "Vout−") via the output terminals 3 and 13.

The operation of the amplifying part 4 according to this embodiment is the same as the operation of the amplifying part 4 according to the embodiment 1 except that the differential signals are output.

As described above, as in the embodiment 1, the variable gain amplifying device according to this embodiment can easily control the gain characteristics and the output power.

EMBODIMENT 8

In the embodiment 7, an example of the configuration of the amplifying part applied to the gain variable amplifying device designed to output differential signals has been described.

In an embodiment 8, an example in which the configuration according to the embodiment 7 is additionally provided with the current source according to the embodiment 3 will be described.

Figure 10:
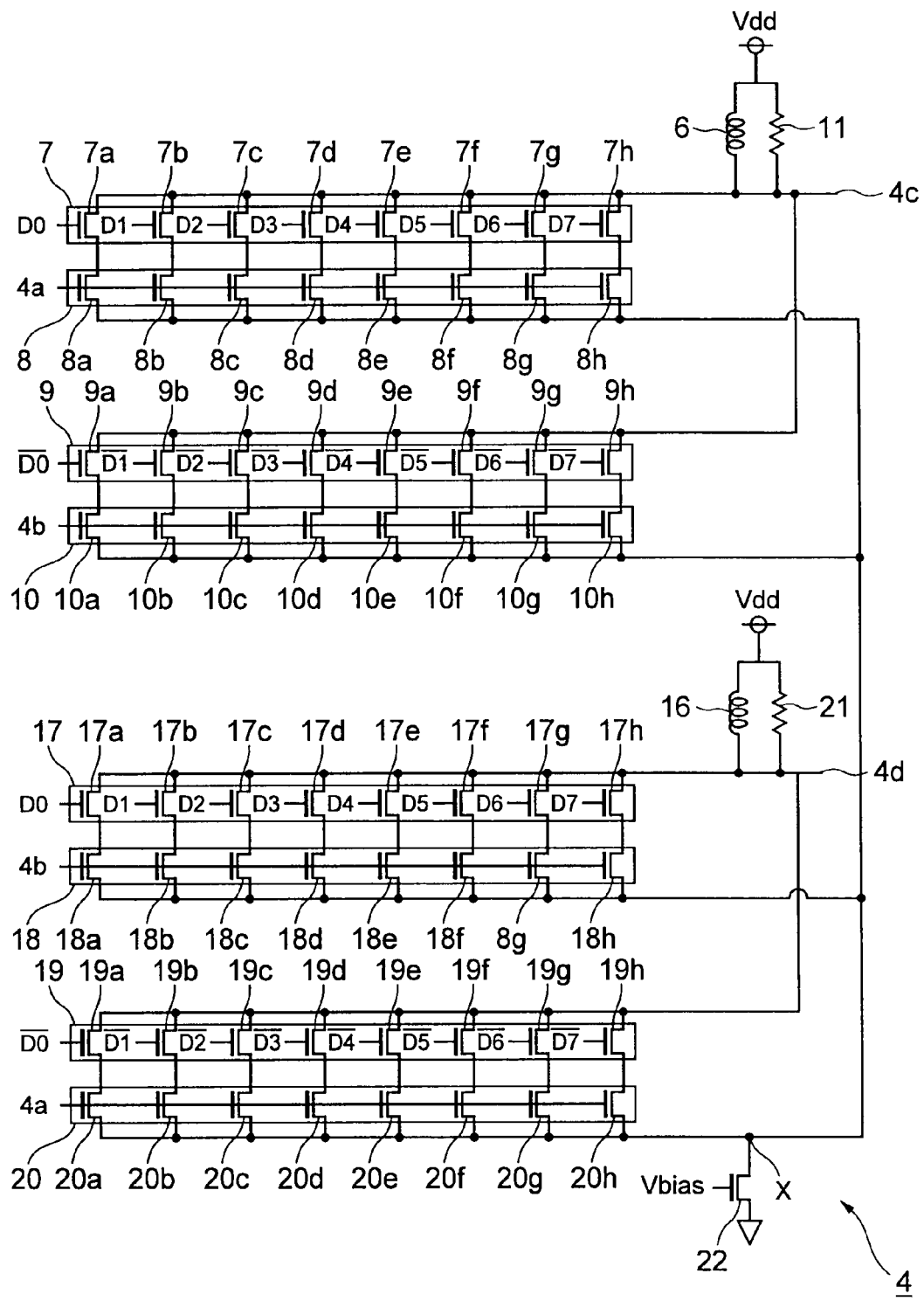
FIG. 10 is a diagram showing a configuration of essential parts of an amplifying part 4 according to the embodiment 8 of the present invention, which is an aspect of the present invention.

FIG. 10 is a diagram showing a configuration of essential parts of an amplifying part 4 according to the embodiment 8 of the present invention, which is an aspect of the present invention.

The components denoted by the same reference numerals as those in the embodiment 7 are the same components as those in the embodiment 7. Furthermore, as with the amplifying part 4 according to the embodiment 7, the amplifying part according to the embodiment 8 is applied to the variable gain amplifying device 500 shown in FIG. 8.

As shown in FIG. 10, compared with the embodiment 7, the amplifying part 4 further has a current source 22 connected between the ground and a point of connection "x" between the remaining ends (sources) of the second MOS transistors 8a to 8h and the remaining ends (sources) of the fourth MOS transistors 10a to 10h. The point of connection "x" is also a point of connection between the remaining ends (sources) of the sixth MOS transistors 18a to 18h and the remaining ends (sources) of the eighth MOS transistors 20a to 20h.

That is, the second, fourth, sixth and eighth MOS transistors are grounded via the current source 22.

As a result, for example, even if the voltage of the power supply "Vdd" fluctuates due to a disturbance or the like, a stable current is supplied to the first to fourth switch stages and the first to fourth amplifying stages from the current source 22. Thus, the amplifying part 4 can stably output the output signal "Vout".

The operation of the variable gain amplifying device 500 in which the amplifying part 4 according to the embodiment 8 is used is the same as the operation in the embodiment 7.

As described above, the variable gain amplifying device according to this embodiment can easily control the gain characteristics and the output power.

What is claimed is:

1. A variable gain amplifying device that amplifies an input signal and outputs the amplified signal, comprising:
    a first input terminal to which a first input signal is input;
    a second input terminal;
    an inductor connected to a power supply at one end;
    an output terminal connected to the other end of said inductor;
    a first switch stage having "n" first MOS transistors having the same size and connected to said other end of said inductor at one end ("n" is an integer equal to or greater than 2);
    a first amplifying stage having "n" second MOS transistors having the same size, the second MOS transistors being connected to said first MOS transistors in a one-to-one correspondence, each of the second MOS transistors being connected between the ground and another end of the corresponding one of said first MOS transistors, and all the second MOS transistors being commonly connected to said first input terminal at the gate thereof;
    a second switch stage having "n" third MOS transistors having the same size as the first MOS transistors and connected to said other end of said inductor at one end thereof,
    a second amplifying stage having "n" fourth MOS transistors having the same size as said second MOS transistors, the fourth MOS transistors being connected to said third MOS transistors in a one-to-one correspondence, each of the fourth MOS transistors being connected between the ground and another end of the corresponding one of said third MOS transistors, and all the fourth MOS transistors being commonly connected to said second input terminal at the gate thereof; and
    a controlling circuit that controls the gain by controlling turning on and off of said first MOS transistors and said third MOS transistors so that the sum of the number of first MOS transistors turned on and the number of third MOS transistors turned on is "n" by outputting a control signal to the gates of said first MOS transistors and said third MOS transistors.

2. The variable gain amplifying device according to claim 1, wherein a second input signal, which has an inverted phase compared to a phase of said first input signal, is input to said second input terminal.

3. The variable gain amplifying device according to claim 2, wherein said controlling circuit
    applies a bias to said first input signal to make said second MOS transistors operate in a linear region, and
    applies a bias to said second input signal to make said fourth MOS transistors operate in a linear region.

4. The variable gain amplifying device according to claim 1, further comprising:
    a resistor connected in parallel with said inductor between said power supply and said one end of said first MOS transistors.

5. The variable gain amplifying device according to claim 2, further comprising:
    a resistor connected in parallel with said inductor between said power supply and said one end of said first MOS transistors.

6. The variable gain amplifying device according to claim 3, further comprising:
    a resistor connected in parallel with said inductor between said power supply and said one end of said first MOS transistors.

7. The variable gain amplifying device according to claim 2, further comprising:
    a first inverter connected between said first input terminal and the gates of said second MOS transistors so that the first inverter is connected to said first input terminal at an input thereof and is connected to the gates of said second MOS transistors at an output thereof; and
    a second inverter connected between said second input terminal and the gates of said fourth MOS transistors so that the second inverter is connected to said second input terminal at an input thereof and is connected to the gates of said fourth MOS transistors at an output thereof,
    wherein said first input signal and said second input signal are digital signals.

8. The variable gain amplifying device according to claim 1, wherein a fixed potential is applied to said second input terminal.

9. The variable gain amplifying device according to claim 1, further comprising:
    a current source connected between said ground and a point of connection between said second MOS transistors and said fourth MOS transistors.

10. The variable gain amplifying device according to claim 2, further comprising:
    a current source connected between said ground and a point of connection between said second MOS transistors and said fourth MOS transistors.

11. The variable gain amplifying device according to claim 3, further comprising:
    a current source connected between said ground and a point of connection between said second MOS transistors and said fourth MOS transistors.

12. The variable gain amplifying device according to claim 4, further comprising:
    a current source connected between said ground and a point of connection between said second MOS transistors and said fourth MOS transistors.

13. The variable gain amplifying device according to claim 5, further comprising:
    a current source connected between said ground and a point of connection between said second MOS transistors and said fourth MOS transistors.

14. The variable gain amplifying device according to claim 6, further comprising:
    a current source connected between said ground and a point of connection between said second MOS transistors and said fourth MOS transistors.

15. The variable gain amplifying device according to claim 7, further comprising:
    a current source connected between said ground and a point of connection between said second MOS transistors and said fourth MOS transistors.

16. The variable gain amplifying device according to claim 8, further comprising:
    a current source connected between said ground and a point of connection between said second MOS transistors and said fourth MOS transistors.

* * * * *